United States Patent
Kawaguchi

[19]

[11] Patent Number: 6,138,205
[45] Date of Patent: Oct. 24, 2000

[54] BURST MODE TYPE SEMICONDUCTOR MEMORY DEVICE

[75] Inventor: Yasunari Kawaguchi, Kanagawa, Japan

[73] Assignee: NEC Corporation, Tokyo, Japan

[21] Appl. No.: 09/141,800

[22] Filed: Aug. 28, 1998

[30] Foreign Application Priority Data

Aug. 28, 1997 [JP] Japan ..................................... 9-232849

[51] Int. Cl.[7] ............................ G06F 12/00; G11C 13/00
[52] U.S. Cl. ........................ 711/104; 711/100; 711/105; 365/182; 365/189.01; 365/233
[58] Field of Search ..................... 711/100, 104, 711/105, 154, 167; 365/189.05, 222, 233, 182, 189.01, 230.01, 230.03

[56] References Cited

U.S. PATENT DOCUMENTS

| | | | |
|---|---|---|---|
| 5,033,027 | 7/1991 | Amin | 365/222 |
| 5,172,341 | 12/1992 | Amin | 365/222 |
| 5,498,990 | 3/1996 | Leung et al. | 327/323 |
| 5,652,723 | 7/1997 | Dosaka et al. | |

OTHER PUBLICATIONS

Abstracts of Japan for Application No.06046947.
Abstracts of Japan for Application No.07311238.

*Primary Examiner*—Tuan V. Thai
*Attorney, Agent, or Firm*—Hutchins, Wheeler & Dittmar

[57] ABSTRACT

In a semiconductor memory device having a burst function, a memory circuit inputs and outputs information corresponding to an external input signal in synchronization with an internal clock signal. A burst operation control circuit receives an external reference clock signal and an enable signal for switching a burst operation mode and a stand-by mode, so as to suspend supplying of the external input signal in the burst operation mode and suspend generation of the first internal clock signal in the stand-by mode.

6 Claims, 12 Drawing Sheets

Fig. 3A PRIOR ART
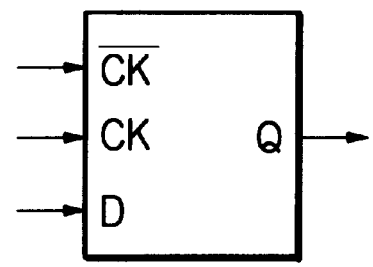
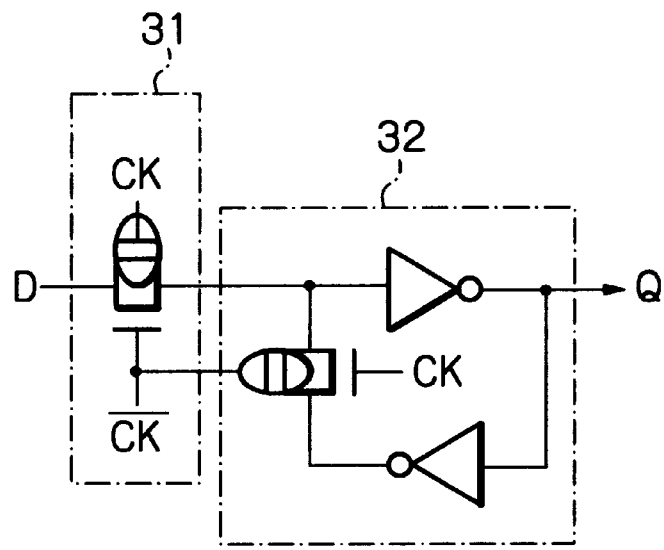
Fig. 3B PRIOR ART
| INPUT | | OUTPUT |
|---|---|---|
| D | CK | Q |
| L | L | H |
| H | L | L |
| — | H | HOLD |

| INPUT | | OUTPUT |
|---|---|---|
| D | CK | Q |
| L | ↑ | L |
| H | ↑ | H |
| — | ↓ | HOLD |

| INPUT | | | OUTPUT |
|---|---|---|---|
| D | R | CK | Q |
| L | H | ↑ | L |
| H | H | ↑ | H |
| — | H | ↓ | HOLD |
| — | L | — | L |

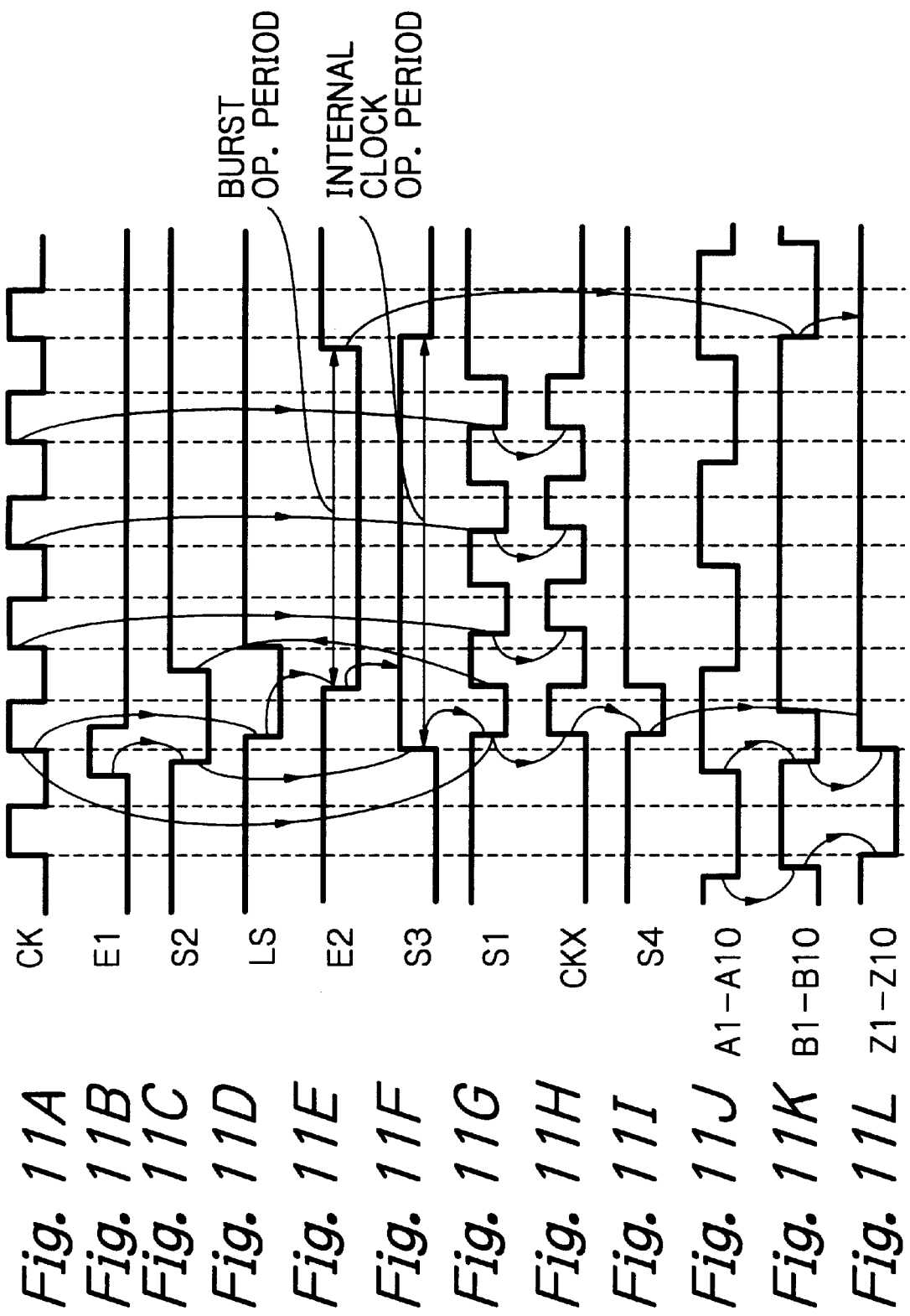

BURST MODE TYPE SEMICONDUCTOR MEMORY DEVICE

BACKGROUND OF THE INVENTION

1. Field of the Invention

The present invention relates to a semiconductor memory device and, more particularly, to a semiconductor memory device having a burst mode feature and adapted to operate with a low power dissipation.

2. Description of the Related Art

Pipeline burst static random access memory (PBSRAM) devices having a burst mode feature have taken a vital role in the rapid improvement of the performance of personal computers in recent years, as they are used as second cache memories. Almost 100% of currently available note-type personal computers including home-use personal computers are provided with one or more PBSRAM devices. PBSRAM devices are required to operate for processing data at a high speed and with a low power dissipation particularly in the case where they are used in note-type personal computers. The term "burst mode features" refers to a feature of carrying out a burst operation of fetching an external start address, thereafter internally and automatically generating the next address and subsequently reading from/writing in the memory circuit. For instance, if the starting address is 1, addresses 1, 2, 3, 4, . . . will be sequentially generated. While the data of the starting address will be output in several cycles, the data of each of the subsequent addresses will apparently be output in one cycle.

A PBSRAM device of the type under consideration that is used as a cache memory is constructed by a synchronous type memory circuit for holding data in synchronization with an external reference clock signal.

A first prior art semiconductor memory device includes a buffer constructed by a plurality of inverters for receiving an external input signal, and a memory circuit constructed by a plurality of memory elements driven by a reference clock signal. This will be explained later in detail.

In the first prior art semiconductor memory device, however, even in a burst operation which does not need the operation of the buffer the buffer always operate, which increases the power dissipation.

In a second prior art semiconductor memory device, an enable signal is a used to suspend the supply of the clock signal, thus decreasing the power dissipation. That is, the buffer constructed by inverters of the first prior art device is replaced by a buffer constructed of NAND circuits. Also, an NAND circuit is provided to mask the clock signal in response to the supply of the enable signal. The NAND circuits of the buffer also mask input signals to the memory circuit. This will also be explained later in detail.

In the second prior art semiconductor memory device, however, it is difficult to internally generate the enable signal to be used exclusively for controlling the clock signal and the memory circuit. Also, since a central processing unit (CPU) is also in a power down state when the enable signal is generated, the CPU is required to issue an additional control signal to be used exclusively for reducing the power dissipation if the power dissipation has to be reduced further.

In a third prior art semiconductor memory device, an enable signal is generated internally to suspend the supply of the clock signal to the memory circuit whenever necessary. For realizing this, a first latch circuit 8 for storing the enable signal and a second latch circuit for latching the output of the first latch circuit and outputting another enable signal are added to the elements of the first prior art device. This will also be explained later in detail.

In the third prior art semiconductor memory device however, while the memory circuit for storing data such as address data and control data does not operate, the buffer for the memory circuit and the clock signal fed to the latch circuits for holding the enable signal operate, thus increasing the power dissipation.

In a fourth prior art semiconductor memory device, comparators for respectively comparing the input signals of the memory circuit with the output signals thereof are added to the memory circuit of the third prior art device (see JP-A-7-262002). This will also be explained later in detail.

Even in the fourth prior art semiconductor memory device the power dissipation is increased. In addition, the power dissipation is increased because the device included the comparators for finding out if any change occurs in the stored information in order to suspend the supply of the clock signal.

SUMMARY OF THE INVENTION

It is an object of the present invention to provide a burst mode type semiconductor memory device capable of reducing the power dissipation.

According to the present invention, in a semiconductor memory device having a burst function, a memory circuit inputs and outputs information corresponding to an external input signal in synchronization with an internal clock signal. A burst operation control circuit receives an external reference clock signal and an enable signal for switching a burst operation mode and a stand-by mode, so as to suspend supplying of the external input signal in the burst operation mode and suspend generation of the first internal clock signal in the stand-by mode.

BRIEF DESCRIPTION OF THE DRAWINGS

The present invention will be more clearly understood from the description as set below, as compared with the prior art, with reference to the accompanying drawings, wherein:

FIG. 3A is a circuit diagram of an example of the memory element of FIG. 2;

FIG. 3B is a truth table of the memory element of FIG. 3A;

FIGS. 11A through 11L are timing diagrams showing the operation of the device of FIG. 8.

DESCRIPTION OF THE PREFERRED EMBODIMENTS

Before the description of the preferred embodiments, prior art semiconductor memory devices will be explained with reference to FIGS. 1, 2, 3A, 3B, 4A, 4B, 5, 6 and 7.

Figure 1:
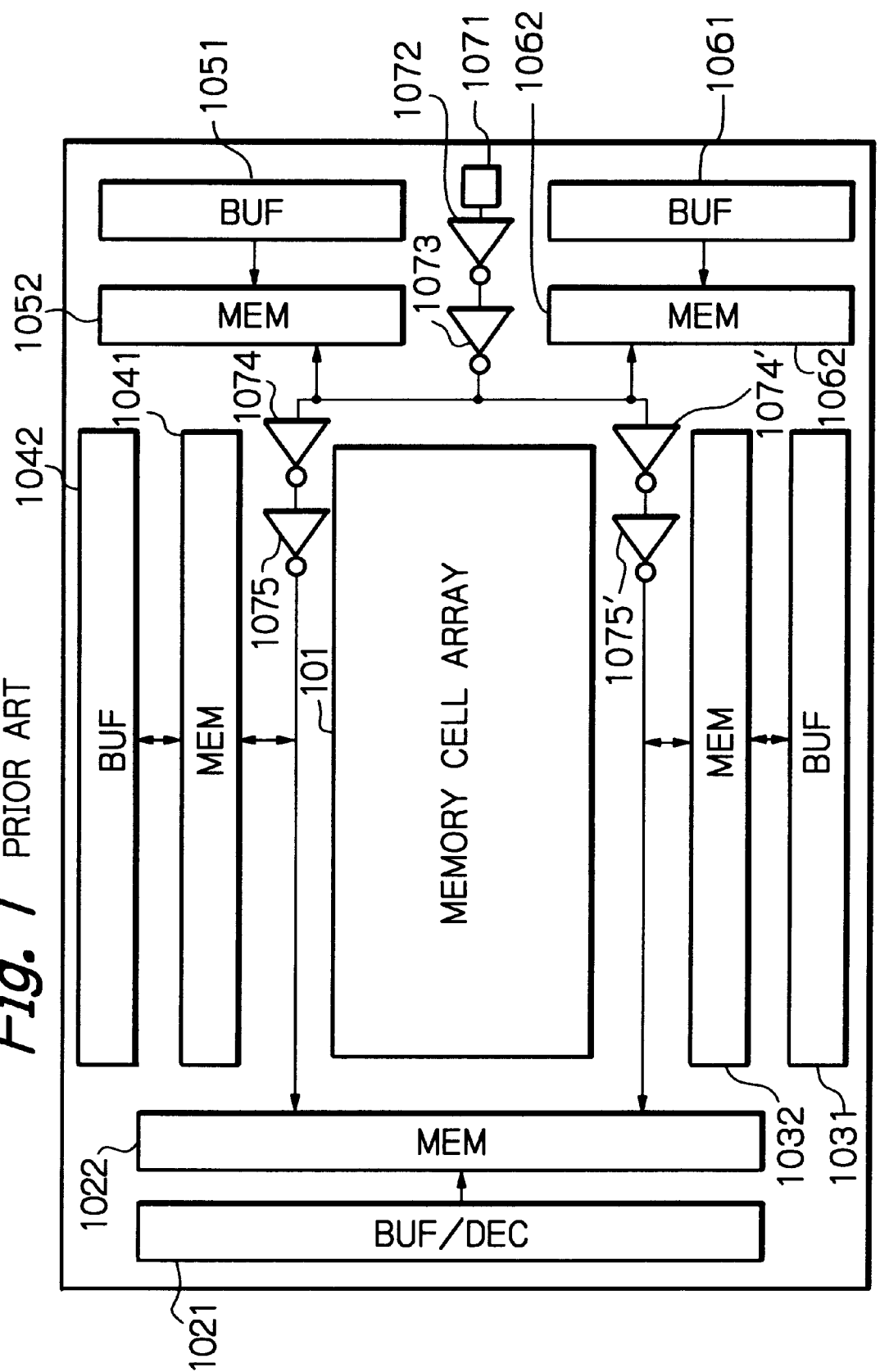
FIG. 1 is a block circuit diagram illustrating a first prior art semiconductor memory device.

In FIG. 1, which illustrates a first prior art semiconductor memory device, reference 101 designates a memory cell array. Also, an address buffer/decoder 1021 and an address memory circuit 1022 are provided. Further, an input/output buffer 1031, an input/output memory circuit 1032, an input/output buffer 1041 and an input/output memory circuit 1042 are provided. Moreover, buffers 1051 and 1061 for control signals and memory circuits 1052 and 1062 for the control signals are provided.

A clock signal CK is supplied from a pad 1071 via inverters 1072, 1073, 1074(1074') and 1075(1075') to the memory circuits 1022, 1032, 1042, 1052 and 1062.

Figure 2:
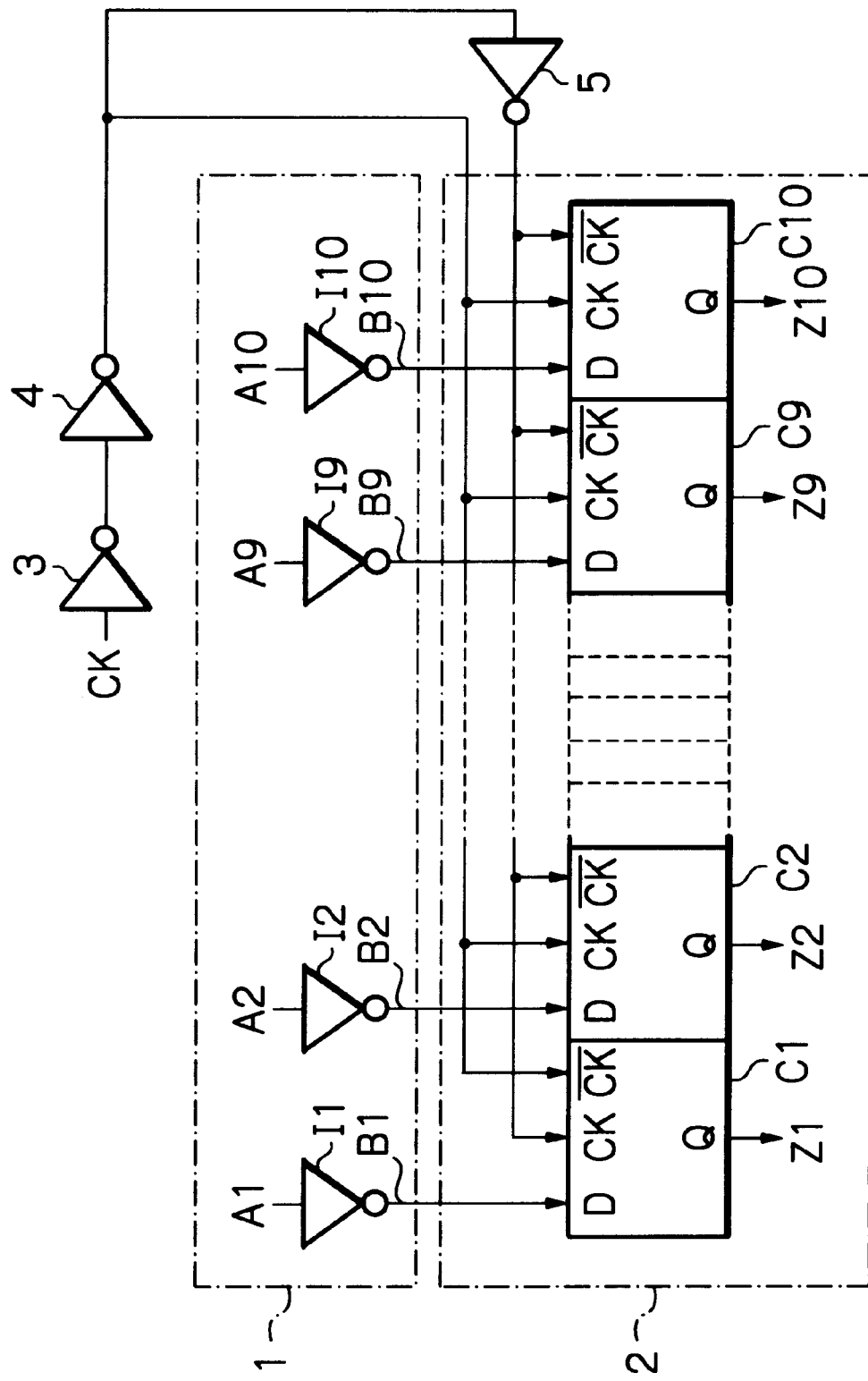
FIG. 2 is a circuit diagram of a representative of one buffer and one memory circuit of the device of FIG. 1.

A representative of one buffer and one memory circuit of the device of FIG. 1 can be illustrated in FIG. 2. That is, a buffer 1 is constructed by a plurality of inverters I1, I2, . . . , I9 and I10 for receiving external input signals A1, A2, . . . , A9, A10, and a memory circuit 2 is constructed by a plurality of memory elements C1, C2, . . . , C9 and C10 driven by a clock signal CK. Also, inverters 3, 4 and 5 are provided. Note that the inverters 3 and 4 correspond to the inverters 1071 through 1075 of FIG. 1.

Each of the memory elements C1, C2, . . . , C9 and C10 can be constructed by a latch circuit as illustrated in FIG. 3A. That is, the latch circuit is formed by transfer gate 31 consisted of a P-type MOS transistor and an N-type MOS transistor and a flip-flop circuit 32 consisting of cross-coupled inverters and a transfer gate. The latch circuit of FIG. 3A operates in synchronization with a clock signal CK and its inverted clock signal CK.

Referring to FIG. 3B, which shows a truth table of the latch circuit of FIG. 3A, the latch circuit keeps its data fetch port open during a period where the clock signal CK is at level "L" so that, if an input data D changes during that period, the output data Q changes accordingly. The data fetch port is closed at a rising edge of the clock signal CK and the latch circuit holds the data during a period where the clock signal CK is held to level H subsequently. Thus, if the input data D has changed during the period where the clock signal CK is at level H, it would not be output until the level of the clock signal CK falls to level L.

Figures 4A, 4B:
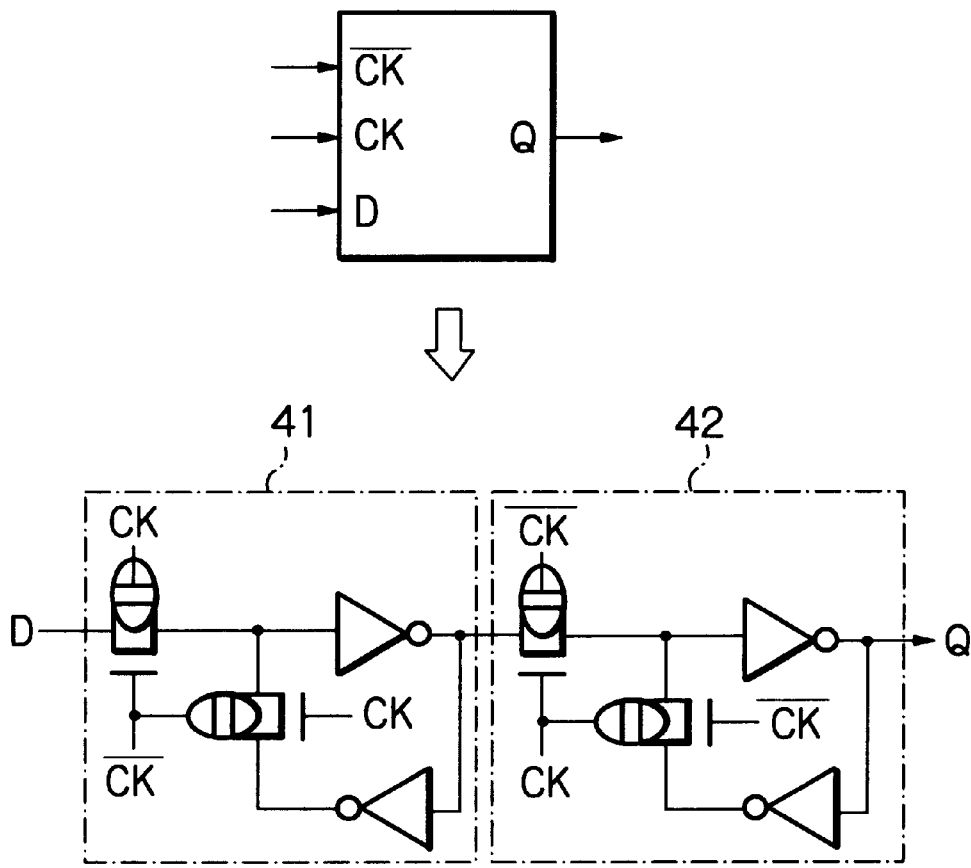
FIG. 4A is a circuit diagram of another example of the memory element of FIG. 2.
FIG. 4B is a truth table of the memory element of FIG. 4A.

Each of the memory elements C1, C2, . . . , C9 and C10 can be constructed by a register as illustrated in FIG. 4A. That is, the register is formed by a master/slave type flip-flop which is produced by connecting two identical latch circuits 41 and 42 as illustrated in FIG. 3A in series.

Referring to FIG. 4B, which is a truth table of the register of FIG. 4A, the master circuit 41 is a latch circuit for fetching data D, and the slave circuit 42 is a latch circuit for holding the data. Output data Q changes as data D is input at a rising edge of the clock signal CK. Thus, the register holds input data D fetched at a rising edge of the clock signal CK until the next rising edge of the clock signal CK.

Therefore, the clock signal CK is used to fetch and store data in the above-mentioned memory elements and outputs the stored data.

In the first prior art semiconductor memory device as illustrated in FIGS. 1 and 2, however, even if the content of at least one of the memory circuits 1022, 1032, 1042, 1052, and 1062 is unchanged, when the clock signal CK is changed, all of the memory circuits 1022, 1032, 1042, 1052 and 1062 are operated, thus increasing the power dissipation. Also, even in a burst operation which does not need the operation of the buffers 1021, 1031, 1041, 1051 and 1061 (i.e., the buffer 1 of FIG. 2), the buffers always operate, which also increases the power dissipation.

Figure 5:
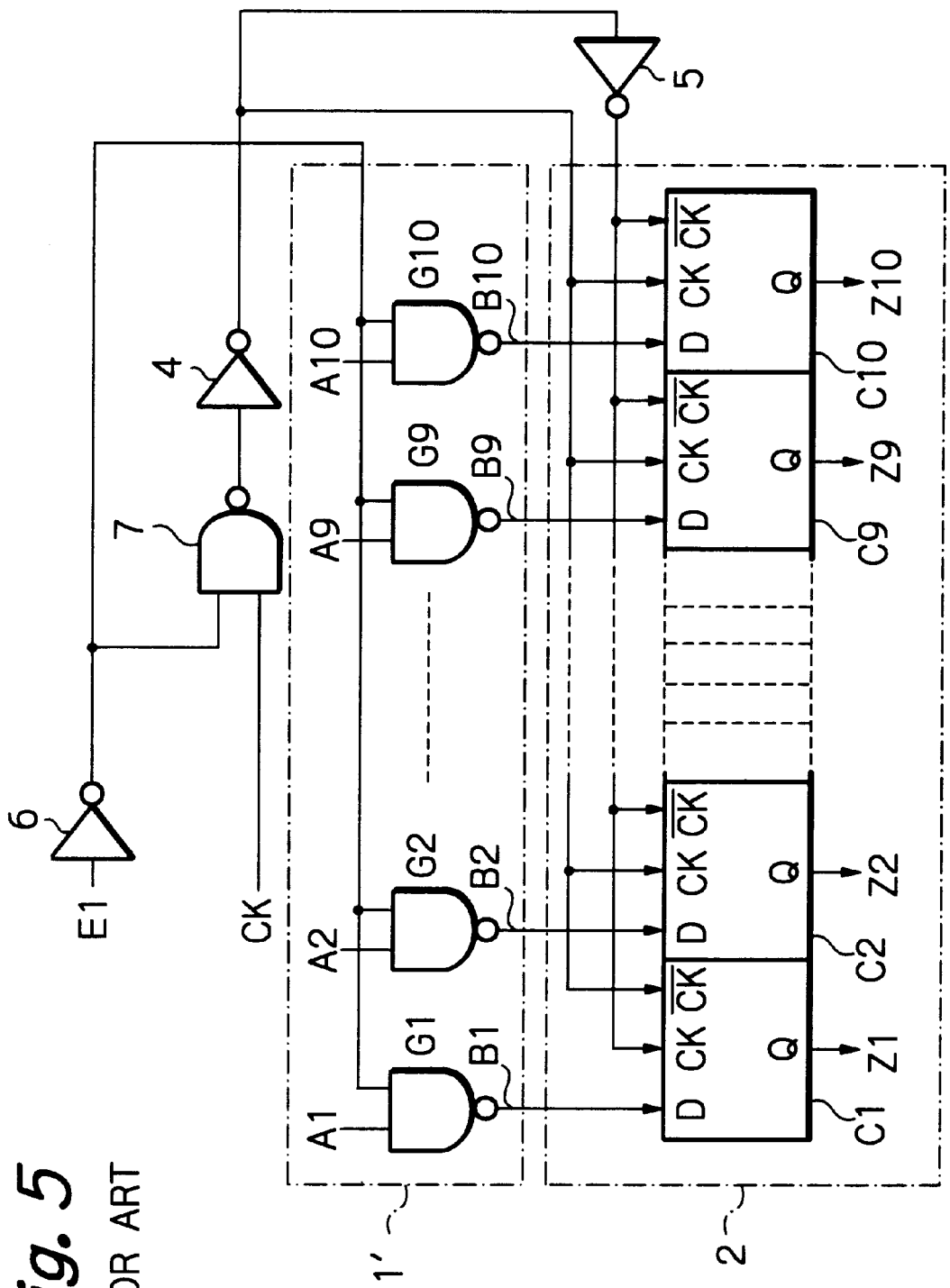
FIG. 5 is a block circuit diagram illustrating a second prior art semiconductor memory device.

In FIG. 5, which illustrates a second prior art semiconductor memory device, an enable signal E1 from a central processing unit (CPU) is used to suspend the supply of the signal CK, thus decreasing the power dissipation. That is, the buffer circuit 1 of FIG. 2 is replaced by a buffer consisting of NAND circuits G1, G2, . . . , G9 and G10. Also, a NAND circuit 7 is provided instead of the inverter 3 of FIG. 2. Further, an inverter 6 is provided to receive an enable signal E1 to controls the NAND circuit 7 and the buffer 1'.

The enable signal E1 is fed from the CPU (not shown) to control a power down state such as a stand-by state. The NAND circuit 7 masks the clock signal CK in response to the supply of the enable signal E1. The NAND circuits G1 through G10 also mask input signals B1 through B10 to the memory circuit 2 from external input signals A1 through A10 such as address signals.

Thus, the memory device of FIG. 5 decreases the power dissipation when the enable signal E1 is at level H, since the enable signal E1 masks the clock signal CK and the input signal to the memory circuit 2 so as not to drive the inverter 4 and the memory circuit 2.

In the second prior art semiconductor memory device as illustrated in FIG. 5, however, it is difficult to internally generate the enable signal E1 to be used exclusively for controlling the clock signal CK and the memory circuit 2. Also, since the CPU is also in a power down state when the enable signal E1 is generated, the CPU is required to issue an additional control signal to be used exclusively for reducing the power dissipation if the power dissipation has to be reduced further.

Figure 6:
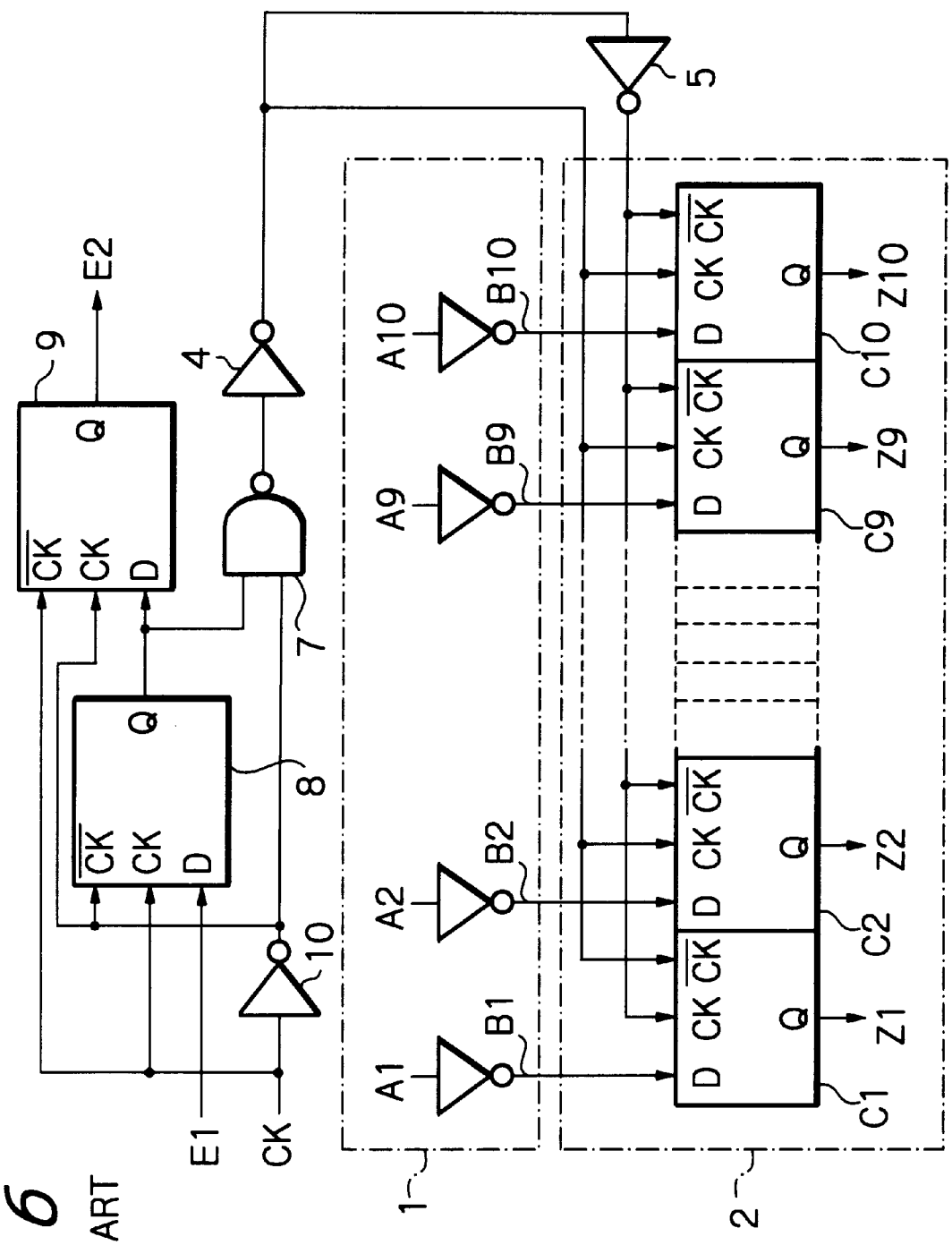
FIG. 6 is a block circuit diagram illustrating a third prior art semiconductor memory device.

In FIG. 6, which illustrates a third prior art semiconductor memory device, an enable signal E1 is generated internally to suspend the supply of the clock signal CK to the memory circuit 2 whenever necessary. That is, in FIG. 6, a NAND circuit 7 is provided instead of the inverter 3 of FIG. 2, and a latch circuit 8 for storing the enable signal E1, a latch circuit 9 for latching the output of the latch circuit 8 and outputting an enable signal E2 and an inverter 10 are added to the elements of FIG. 2.

In FIG. 6, when the input data A1 through A10 are not effective, the clock signal CK is masked by the latch circuit 8 that holds the enable signal E1 and the NAND circuit 7. Thus, no unnecessary data is fetched to reduce the power dissipation of the device.

In the third prior art semiconductor memory device of FIG. 6, however, while the memory circuit 2 for storing data such as address data and control data do not operate, the buffer 1 for the memory circuit 2 and the clock signal CK fed to the latch circuits 8 and 9 for holding the enable signal E1 operate, thus increasing the power dissipation.

Figure 7:
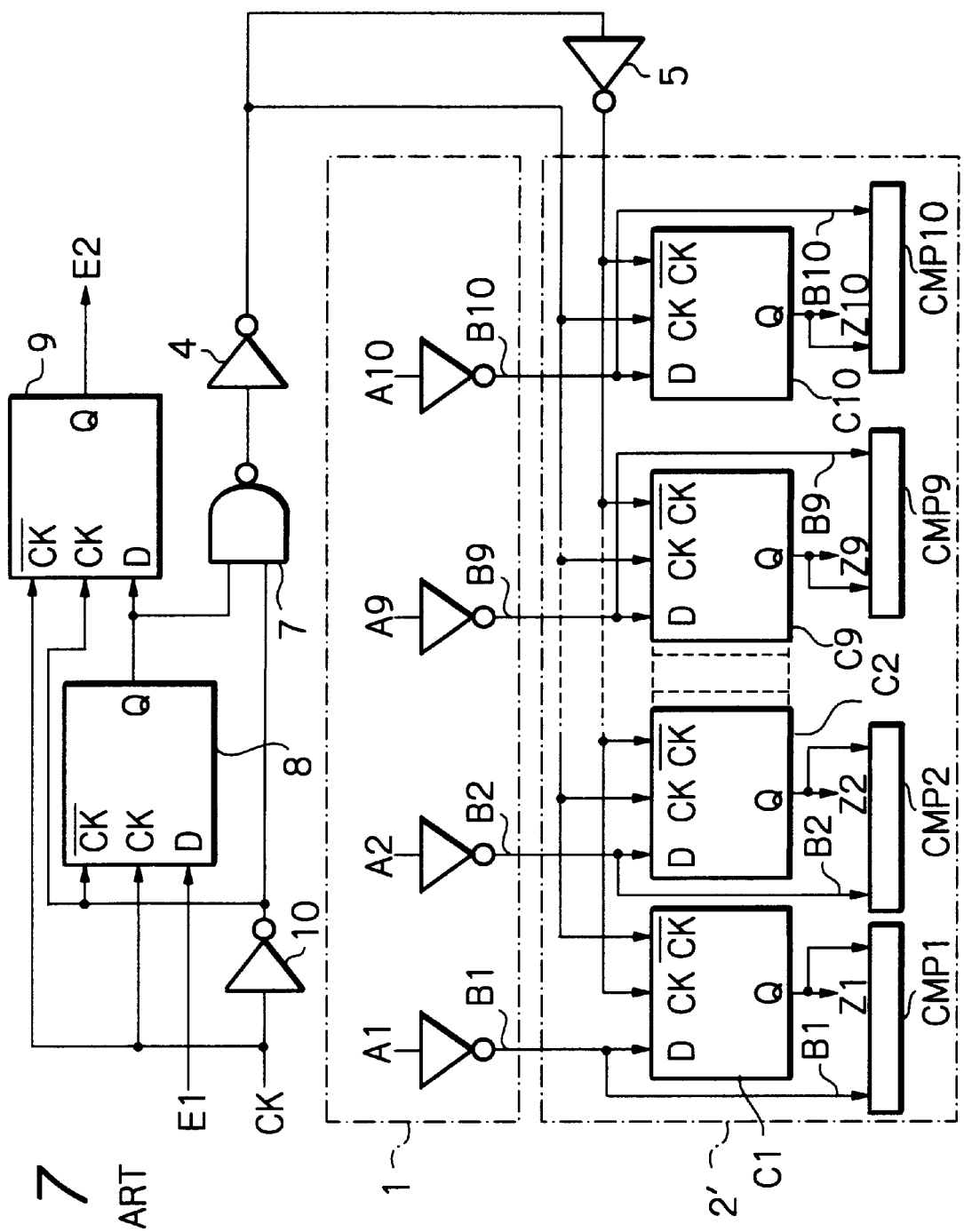
FIG. 7 is a block circuit diagram illustrating a fourth prior art semiconductor memory device.

In FIG. 7, which illustrates a fourth prior art semiconductor memory device, a memory circuit 2' is provided instead of the memory circuit 2 of FIG. 6. That is, comparators CMP1, CMP2, . . . , CMP9 and CMP10 for comparing the input signals B1, B2, . . . , B9 and B10 of the memory circuit 2' with the output signals Z1, Z2, . . . , Z9 and Z10, respectively, thereof are added to the memory circuit 2 of FIG. 6 (see JP-A-7-262002).

In the memory circuit 2' of FIG. 7, the input signals B1 through B10 to the memory circuit 2' are compared with the data fetched immediately therebefore to find out if any change occurs therebetween. If no change occurs, no clock signal is given to the memory circuit 2 in order to suspend its operation, thus decreasing the power dissipation.

Even in the fourth prior art semiconductor memory device of FIG. 7, while the memory circuit 2' for storing data such as address data and control data do not operate, the buffer 1 for the memory circuit 2' and the clock signal CK fed to the latch circuits 8 and 9 for holding the enable signal E1 operate, thus increasing the power dissipation. In addition, the power dissipation is increased because the device includes the comparators CMP1, CMP2, . . . , CMP9 and CMP10 for finding out if any change occurs in the stored information in order to suspend the supply of the clock signal CK.

Figure 8:
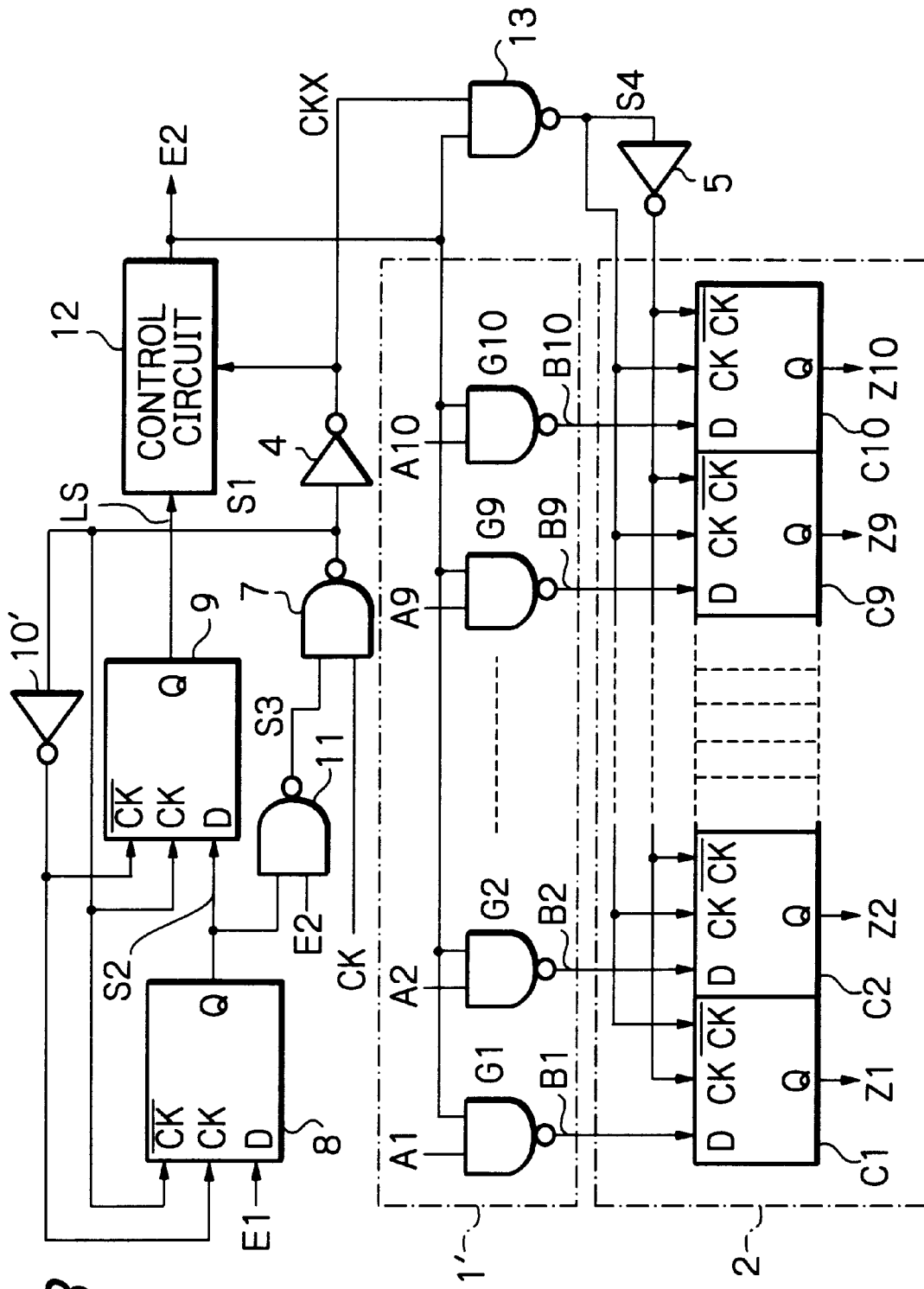
FIG. 8 is a block circuit diagram illustrating a first embodiment of the semiconductor memory device according to the present invention.

In FIG. 8, which illustrates a first embodiment of the present invention, the buffer 1 of FIG. 6 is replaced by the buffer 1' of FIG. 5. Also, the inverter 10 of FIG. 6 is replaced by an inverter 10'. Further, a NAND circuit 11, a control circuit 12 and a NAND circuit 13 are added to the elements of FIG. 6.

The NAND circuit 11 receives an output signal S2 of the latch circuit 8 and an enable signal E2 for defining a burst period, and generates an output signal S3. Also, the control circuit 12 receives a latch signal LS from the latch circuit 9 and a buffer clock signal CKX from the inverter 4, and generates the enable signal B2. Further, the NAND circuit 13 receives the enable signal E2 and buffer clock signal CKX, and generates an output signal S4.

The control circuit 12 of FIG. 8 is explained next in detail with reference to FIG. 9.

Figure 9:
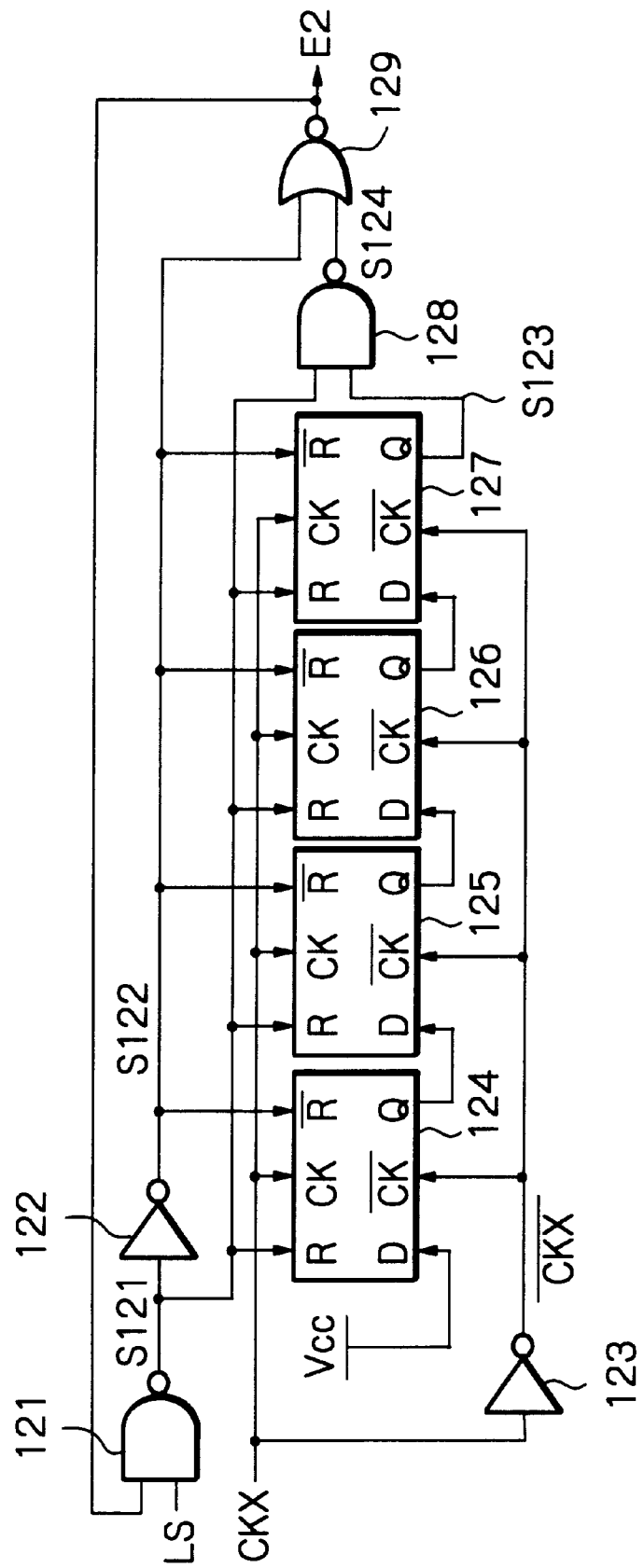
FIG. 9 is a detailed circuit diagram of the control circuit of FIG. 8.

In FIG. 9, a WAND circuit 121 receives the latch signal LS and the enable signal E2 to generate a signal S121. Also, an inverter 122 receives the signal S121 and generates its inverted signal S122. Further, an inverter 123 receives the buffer clock signal CKX and generates its inverted buffer signal $\overline{CKX}$.

Four registers 124, 125, 126 and 127 are connected in series. In this case, the register 124 receives a power supply voltage $V_{CC}$ as at its input terminal D, and the register 127 generates a signal S123 at its output terminal Q. Each of the registers 124, 125, 126, and 127 has a reset terminal R for receiving the signal S121, a reset terminal $\overline{R}$ for receiving the signal S122, a clock terminal CK for receiving the buffer clock signal CKX and a clock terminal $\overline{CK}$ for receiving the buffer clock signal $\overline{CKX}$.

Additionally, a NAND circuit 128 receives the signals S121 and S123 and generates a signal S124. Also, a NOR circuit 129 received the signals S122 and S124 and generates the enable signal E2.

Figures 10A, 10B:
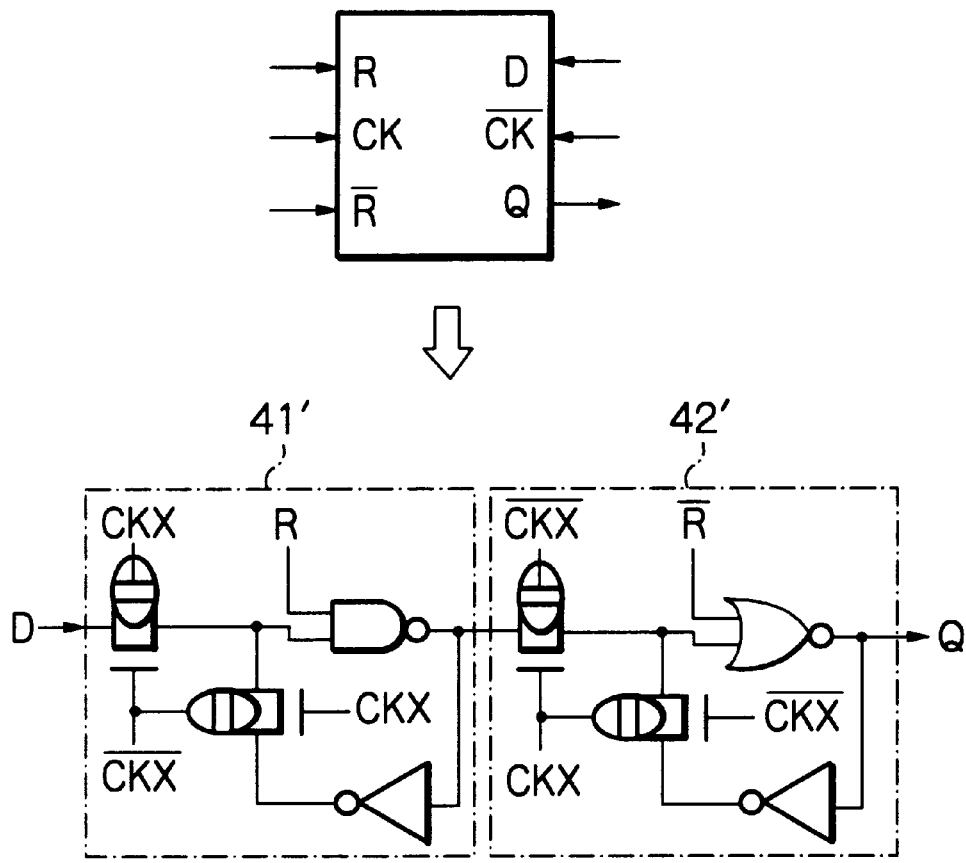
FIG. 10A is a circuit diagram of an example of the register of FIG. 9.
FIG. 10B is a truth table of the register of FIG. 10A.

Each of the registers 124, 125, 126 and 127 can be constructed by a register as illustrated in FIG. 10A. That is, the register is formed by a master/slave type flip-flop with a reset function. In this case, in a master circuit 41', one inverter of the master circuit 41 of FIG. 4A is replaced by a NAND circuit that receives the signal S121 as a reset signal. Also, in a slave circuit 42', one of the inverter of the slave circuit 42 of FIG. 4A is replaced by a NOR circuit that receives the signal S122 as a reset signal.

Referring to FIG. 10B, which is a truth table of the register of FIG. 10A, when the signals at the reset terminal R and $\overline{R}$ are high and low respectively, the register of FIG. 10A operates in the same way as that of FIG. 4A. On the other hand, when the signals at the reset terminals R and $\overline{R}$ become low and high, respectively, the output signal Q becomes low.

Now, the operation of the device of FIG. 8 will be explained with reference to FIGS. 11A through 11L. The latch circuit 8 latches an enable signal E1 as shown in FIG. 11B in synchronization with a reference clock signal CK as shown in FIG. 11A, and feeds one of the inputs of the NAND circuit 11 with a latched enable signal S2. Note that the enable signal E1 is typically generated by the logic of a chip enable signal or a control signal coming from the CPU (not shown).

Upon receipt of latch signal S2 of the latch circuit 8 and an enable signal E2 output from the control circuit 2 as shown in FIG. 11E, the NAND circuit 11 obtains an inverted AND logic signal S3 of these signals as shown in FIG. 11F and feeds one of the inputs of the NAND circuit 7 with the signal S3. Note that the signal S3 defines an internal clock signal operation period.

Upon receipt of the signal S3 and the reference clock signal CK, the NAND circuit 7 obtains an inverted AD logic signal S1 of the signals as shown in FIG. 11G and feeds the latch circuit 8, the latch circuit 9 and the inverter 4 with the clock signal S1. The inverter 4 inverts the clock signal S1 and feeds the control circuit 12 and the NAND circuit 13 with a buffer clock signal CKX as shown in FIG. 11H that is an internal clock signal of the chip for controlling the memory circuit 2.

The latch circuit 9 latches the output signal S2 of the latch circuit 8 in synchronization with the clock signal S1 and feeds the control circuit 12 with an output signal LS that corresponds to the latched signal S2.

In FIG. 9, a supply voltage $V_{CC}$ is applied to the input of the register 124 and an output signal 124 of the register 124 is fed to the input of the register 125. An output signal Q125 of the register 125 is fed to the input of the register 126, and an output signal Q126 of the register 126 is fed to the input of the register 127. Finally, an output signal Q127 of the register 127 is fed to one of the inputs of the NAND circuit 128.

Also, in FIG. 9, upon receipt of the signal LS and the enable signal E2, the NAND gate 121 feeds the inverter 122, the registers 124 through 127 and one of the inputs of the NAND circuit 128 with its output signal 121. The inverter 122 inverts the signal S121 and feeds one of the inputs of the NOR circuit 129 with its inverted signal S122. Upon receipt of the signal S121 and the output signal S123 of the register 127, the NAND circuit 128 obtains an inverted AND logic signal S124 of these signals and feeds the other input of the NOR circuit 129 with the output signal S124. The NOR circuit 129 obtains a NOR logic signal of the signals S122 and S124 and outputs this signal as the enable signal E2.

Returning to FIG. 8, the device is in a stand-by state before the start of a burst operation and, in a stand-by state, the enable signal E1 is at level L while the enable signal E2 is at level A, as shown in FIGS. 11B and 11E.

When the enable signal E1 is at level L and the enable signal E2 is at level H, the output signal S2 of the NAND circuit 11 is at level H, and the output signal S3 of the latch circuit 8 is at level L as shown in FIG. 11F. When the signal S3 is at level L, the clock signal S1 output from the NAND circuit 7 is held to level H as shown in FIG. 11G so that consequently the buffer clock signal CKX is held to level L as shown in FIG. 11H to make the signals S1 and CKX inoperative as clock signals. Thus, the NAND circuit 13, the latch circuit 8, the latch circuit 9 and the control circuit 12 that are designed to be driven by the clock signal S1 or CKX are no longer fed with a clock signal.

Under the condition where no clock signal is fed, the latch circuit 8 is held in a state where its data fetch port is open in order to make it possible to resume the normal supply of clock signals when a burst operation is started in view of the fact that no clock signal is fed to the latch circuits 8 and 9 in a stand-by state. In other words, it is possible to bring the output signal S3 of the NAND circuit 11 up to level H in advance to a rising edge of the reference clock signal CK, utilizing the fact that the enable signal E1 is fed from the CPU earlier than a clock signal by the set-up time (normally several nanoseconds).

In a burst operation, when the enable signal E1 is brought up to level H at a rising edge of the reference clock signal CK as shown in FIGS. 11A and 11B, the output signal S2 of the latch circuit 8 is brought down to level L as shown in FIG. 11C, because the data fetch port of the latch circuit 8 is open. As the signal S2 goes to level L, the output signal S3 of the NAND circuit 11 rises to level H as shown in FIG. 11F and the NAND circuit 7 feeds the latch circuit 8, the latch circuit 9 and the inverter 4 with the clock signal S1 upon receiving the clock signal CK as shown in FIG. 11A. The inverter 4 inverts the clock signal S1 and outputs its inverted clock signal CKX as shown in FIG. 11H to the control circuit 12 and the NAND circuit 13. Since the enable signal E2 is at level E as shown in FIG. 11E, the NAND circuit 13 outputs a clock signal S4 as shown in FIG. 11I that corresponds to the clock signal CKX.

Upon receiving the clock signal S4, the memory circuit 2 outputs output signals Z1 through Z10 that correspond respectively to input signals B1 through B10. The latch circuit 9 outputs the signal S2 latched by the latch circuit 8 and feeds the control circuit 12 with it as a latch signal LS as shown in FIG. 11D.

In FIG. 9, the control circuit 12 brings the output signal S121 of NAND circuit 121 to level L because the signal LS is at level H. As the output signal S121 goes to level L, the output signals of all the NAND circuits in the registers 124 through 127 rise to level H, while the output signals of all the NOR circuits in the registers 124 through 127 or the signals 124 through 127, fall to level L As a result, the output signal S124 of the NAND circuit 128 goes to level H, while the enable signal E2 that is the output signal of the NOR circuit 129 falls to level L.

In response to the enable signal E2 that goes to level L, the output signal S121 of the NAND circuit 121 goes to level H regardless of the level of the output signal LS of the latch circuit 9 and, at the same time, the output signal S3 of the NAND circuit 11 also goes to level H regardless of the level of the latch signal S2 of the latch circuit 8, as shown in FIGS. 11C and 11F.

Additionally, also in response to the enable signal E2 that goes to level L, the output signals of the NAND circuits G1 to G10 or input signals B1 through B10 of the memory circuit 2 as shown in FIG. 11K and the output signal of the NAND circuit 13 or the memory control signal s4 are held to level L, as shown in FIG. 11I. As the memory control signal S4 is held to level H, the memory circuit 2 becomes inoperative, holding the information Z1 to Z10 as shown in FIG. 11L at the time when the burst startson the burst starts.

As the output signal S121 of the NAND circuit 121 is held to level H as a result of the fall to level L of the enable signal E2, the supply voltage $V_{CC}$ that is applied to the register 124 as an input signal each time the clock signal CKX is supplied, that is, the level H, sequentially shifts the registers 124, 125, 126, 127, and the register 127 outputs an output signal S123 at level H. Upon receiving the H-level signal 5123, the NAND circuit 128 brings the output signal S124 to level L and feeds the NOR circuit 129 with this signal. As the signal S124 falls to level L, the NOR circuit 129 brings the enable signal E2 to level H in response and terminates the burst operation period.

A burst operation period where the enable signal E2 is at level L is determined by the number of registers. While a total of four registers are used in FIG. 9, the number of registers that can be used has no limit. Also, the data to be shifted may be at level L.

Returning to FIG. 8, after terminating the burst operation to bring the enable signal E2 to level H, the level of the output signal S3 of the NAND circuit 11 is determined by the level of the latch signal S2 of the latch circuit 8. Since the latch circuit 8 normally latches the enable signal E1 at level L at the end of a burst operation, the latch signal S2 is fed to the NAND circuit 11 at level H. If both the enable signal E2 and the latch signal S2 are at level H, the NAND circuit 11 brings the signal S3 to level L in response to a fall of the signal E2 or S2 to level L and feeds them to the NAND circuit 7. Upon receiving the signal S3 at level L, the NAND circuit 7 holds its output clock signal S1 at level H and suspends the supply of the clock signal CK as described above. As the supply of the clock signal CK is suspended, the data fetch port of the latch circuit 8 is opened simultaneously to make the device ready for the next burst operation.

Thus, the power dissipation of the device can be reduced, since the supply of all internal clock signals is suspended in a stand-by state whereas the buffer 1' is inactivated and the supply of clock signals to the memory circuit 2 is suspended in a burst operation state. A burst operation can be started without any problem if the supply of clock signals to the latch circuits 8 and 9 that are adapted to store the enable signal E1 in a stand-by state is suspended by making use of the set-up time of the enable signal E1.

As explained above, the first embodiment does not require address information and other information to be taken into the memory circuit 2 during a burst operation, and the supply of clock signals and input signals to the memory circuit 2 is suspended. Thus, if the supply voltage is 3.3V, about 20 mA can be saved by inactivating the NAND circuits G1, G2, . . . , G9, G10 of the buffer 1.

Figure 12:
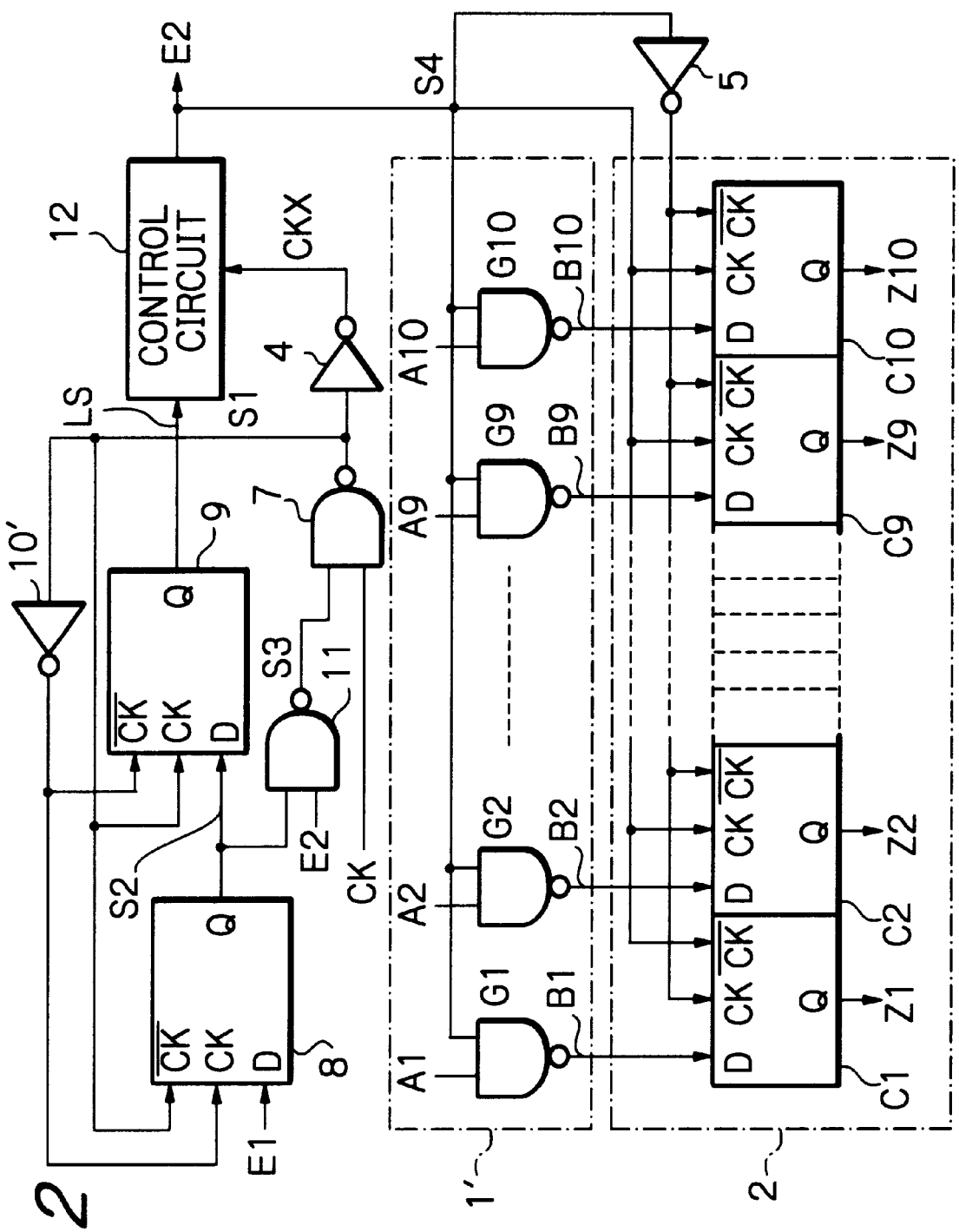
FIG. 12 is a block circuit diagram illustrating a second embodiment of the semiconductor memory device according to the present invention.

In FIG. 12, which illustrates a second embodiment of the present invention, the WAND circuit 13 of FIG. 8 is omitted and the memory circuit 2 is controlled not by the clock signal CKX but by the enable signal E2 as a result of feeding the enable signal E2 directly to the buffer 1'.

The operation of the device of FIG. 12 is explained next. In the same way as in the first embodiment, the enable signal E2 falls from level H to level L when a burst operation is started. The NAND circuit 11 changes the level of the output signal S3 to level H in response to the fall to level L of the enable signal E2 and then feeds the signal S3 to the NAND circuit 7. The NAND circuit 7 fetches the reference clock signal CK in response to the rise to level H of the signal S3 and starts supplying the internal clock signal SI and the clock signal CKX by way of the inverter 4. Then, output signals D1 through B10 of the NAND circuits G1, G2, . . . , G9, G10, are held to level L and, at the same time, signals B1 through B10 that correspond respectively to input data A1 through A10 are stored in the memory circuit 2. When the input signals A1 through A10 are held for a sufficiently long time relative to the reference clock signal CK, the input signals A1 through A10 can be stored in the memory circuit 2 by means of the enable signal E2 that is generated later than the clock signal CKX.

Since the enable signal E2 is held to level H in a stand-by state, it entails an effect of suspending the supply of all clock signals. Additionally, the data fetch port of the latch circuit 8 is held open to make the device ready for the next burst operation.

Thus, as in the case of the first embodiment, the power dissipation of the device can be reduced, since the supply of all internal clock signals is suspended in a stand-by state whereas the buffer 1' is inactivated and the supply of clock signals to the memory circuit 2 is suspended in a burst operation state. A burst operation can be started without problem if the supply of clock signals to the latch circuits 8 and 9 that are adapted to store the enable signal E1 in a stand-by state is suspended by making use of the set-up time of the enable signal E1.

Additionally, the load on the clock signal CKX can be reduced to improve the access speed thereof by controlling not the clock signal CKX but the enable signal E2 in the second embodiment.

As explained hereinabove, according to the present invention, since the supply of any external input signal in a burst operation state is suspended and the generation of any internal clock signal in a stand-by state is suspended, the use of a control signal to be used for reducing the power dissipation of the device can be eliminated and hence the power dissipation can be reduced by generating a control signal for suspending the supply of any clock signal to the internal circuits including the memory circuit by means of the existing control signal of the CPU in a stand-by state.

Additionally, since the operation of any unnecessary circuits can be suspended in a burst operation state by utilizing the control signal to be used for suspending the supply of a clock signal to internal circuits, the power dissipation in a burst operation can be reduced.

What is claimed is:

1. A semiconductor memory device having a burst function, comprising:
   a memory circuit for input/outputting information corresponding to an external input signal in synchronization with a first internal clock signal; and
   a burst operation control circuit, connected to said memory circuit, for receiving an external reference clock signal and a first enable signal for switching a burst operation mode and a stand-by mode, suspending supplying of said external input signal in said burst operation mode and suspending generation of said first internal clock signal in said stand-by mode;
   wherein said burst operation control circuit comprises:
      a first latch circuit for latching said first enable signal in response to a second internal clock signal and generating a first latch signal;
      a second latch circuit, connected to said first latch circuit, for latching said first latch signal in response to said second internal clock signal and generating a second latch signal;
      a first NAND circuit, connected to said first latch circuit, for receiving said first latch signal and a second enable signal for defining a period of said burst operation mode and generating a NAND logic signal;
      a second NAND circuit, connected between said first NAND circuit and said first and second latch circuits, for receiving said NAND logic signal and said external reference clock signal and generating said second internal clock signal;
      an inverter, connected to said second NAND circuit, for receiving said second internal clock signal and generating a third internal clock signal; and
      a burst control circuit, connected to said second latch circuit and said inverter, for receiving said second latch signal and said third internal clock signal and generating said second enable signal.

2. The device as set forth in claim 1, wherein said burst operation control circuit further comprises a third NAND circuit (13), connected to said inverter and said burst control circuit, for receiving said third internal clock signal and said second enable signal and generating said first internal clock signal.

3. The device as set forth in claim 1, wherein said second enable signal is used as said first internal clock signal.

4. The device as set forth in claim 1, further comprising a buffer, connected to said memory circuit and said burst control circuit, for receiving said external input signal and transmitting said external input signal to said memory circuit in response to said second enable signal.

5. The device as set forth in claim 4, wherein said buffer comprises a plurality of NAND circuits each having a first input for receiving one bit of said external input signal, a second input for receiving said second enable signal, and an output connected to said memory circuit.

6. The device as set forth in claim 1, wherein said burst control circuit comprises a plurality of registers connected in series, for holding said second latch signal for a predetermined period and generating said second enable signal.

* * * * *